United States Patent
Lane et al.

(10) Patent No.: US 7,081,408 B2
(45) Date of Patent: Jul. 25, 2006

(54) METHOD OF CREATING A TAPERED VIA USING A RECEDING MASK AND RESULTING STRUCTURE

(75) Inventors: Ralph L. Lane, Gilbert, AZ (US); Charles D. Hill, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/975,572

(22) Filed: Oct. 28, 2004

(65) Prior Publication Data

US 2006/0094231 A1    May 4, 2006

(51) Int. Cl.
*H01L 21/4763* (2006.01)
*H01L 23/52* (2006.01)

(52) U.S. Cl. .................. 438/637; 640/589; 257/774
(58) Field of Classification Search ............... 438/637, 438/640, 589; 257/774
See application file for complete search history.

(56) References Cited

U.S. PATENT DOCUMENTS 5,374,503 A * 12/1994 Sachdev et al. ............ 430/323
6,577,010 B1 * 6/2003 Batra et al. .................. 257/751

* cited by examiner

*Primary Examiner*—Michael Lebentritt
*Assistant Examiner*—Mohsen Ahmadi
(74) *Attorney, Agent, or Firm*—Kerry D. Tweet (57) ABSTRACT

Embodiments of a method of forming a tapered via using a receding mask are disclosed. In one embodiment, an etch mask formed on a substrate includes a first aperture in a first photoresist layer and a second, larger aperture in an overlying second photoresist layer. Peripheries of the first and second apertures may be tapered as a result of an out-of-focus exposure. An etching process may be performed to create a tapered via in the substrate, and during this etching process, the first, relatively thinner photoresist layer will recede outwardly toward the aperture in the second photoresist layer. Other embodiments are described and claimed.

22 Claims, 7 Drawing Sheets

METHOD OF CREATING A TAPERED VIA USING A RECEDING MASK AND RESULTING STRUCTURE

FIELD OF THE INVENTION

The disclosed embodiments relate generally to the fabrication of semiconductor devices and, more particularly, to a method of forming a tapered via using a receding mask.

BACKGROUND OF THE INVENTION

Vias are routinely used structures in the construction of integrated circuit (IC) devices. By way of example, vias may be used to form electrical connections between various layers of conductors in the interconnect structure of an IC die. By way of further example, vias may also be formed that extend from the backside of an IC die to the active or front side, such vias often referred to as "through-silicon vias." Through-silicon vias can, for example, be used to form backside interconnects for a pair of bonded wafers, the bonded wafers forming a wafer stack that is ultimately cut into a number of stacked die.

The aspect ratio of a via can be defined as a ratio of the via's depth (or length) to the via's diameter (or width). Through-silicon vias typically have relatively high aspect ratios due to the thickness of the semiconductor wafers used to fabricate integrated circuit devices. For example, through-silicon vias can have aspect ratios reaching 10:1, or greater. Semiconductor manufacturers have developed processes to create such high aspect ratio vias with substantially straight sidewalls; however, film deposition on the side walls of high aspect ratio vias can be difficult. For example, the ability to use sputtering and electroplating processes to deposit metal films and other materials may be limited for high aspect ratio vias. The formation of oxide films may also be difficult where the aspect ratio of a via is high.

The aspect ratio of a via can be decreased either by decreasing the via's depth and/or by increasing the via's diameter. Often the depth of a through-silicon via is a parameter that is "fixed" by the thickness of a semiconductor wafer, or by the extent to which the wafer's backside can be thinned. Thus, where the ability to decrease the via depth is limited, semiconductor manufacturers may turn to enlarging the via diameter in order to decrease the aspect ratio. However, as a through-silicon via extending from the wafer's backside approaches the front or active side—e.g., the region of the wafer where transistors and other active devices are formed—available "real estate" may be limited and interference with the integrated circuitry can be a concern.

DETAILED DESCRIPTION OF THE INVENTION

Disclosed are embodiments of a method of forming a tapered via using a receding mask. In one embodiment, an etch mask is formed on a substrate by creating a first aperture in a first photoresist layer and by creating a second, larger aperture in an overlying second photoresist layer. According to one embodiment, the peripheries of the first and second apertures may be tapered as a result of an out-of-focus exposure. An etching process may be performed to create a via in the substrate, and during etching the first, relatively thinner photoresist layer will recede outwardly toward the aperture in the second photoresist layer. A via having tapered sidewalls is formed, and these tapered sidewalls result, at least in part, from the tapered apertures in the etch mask and/or the receding mask.

Figure 1:
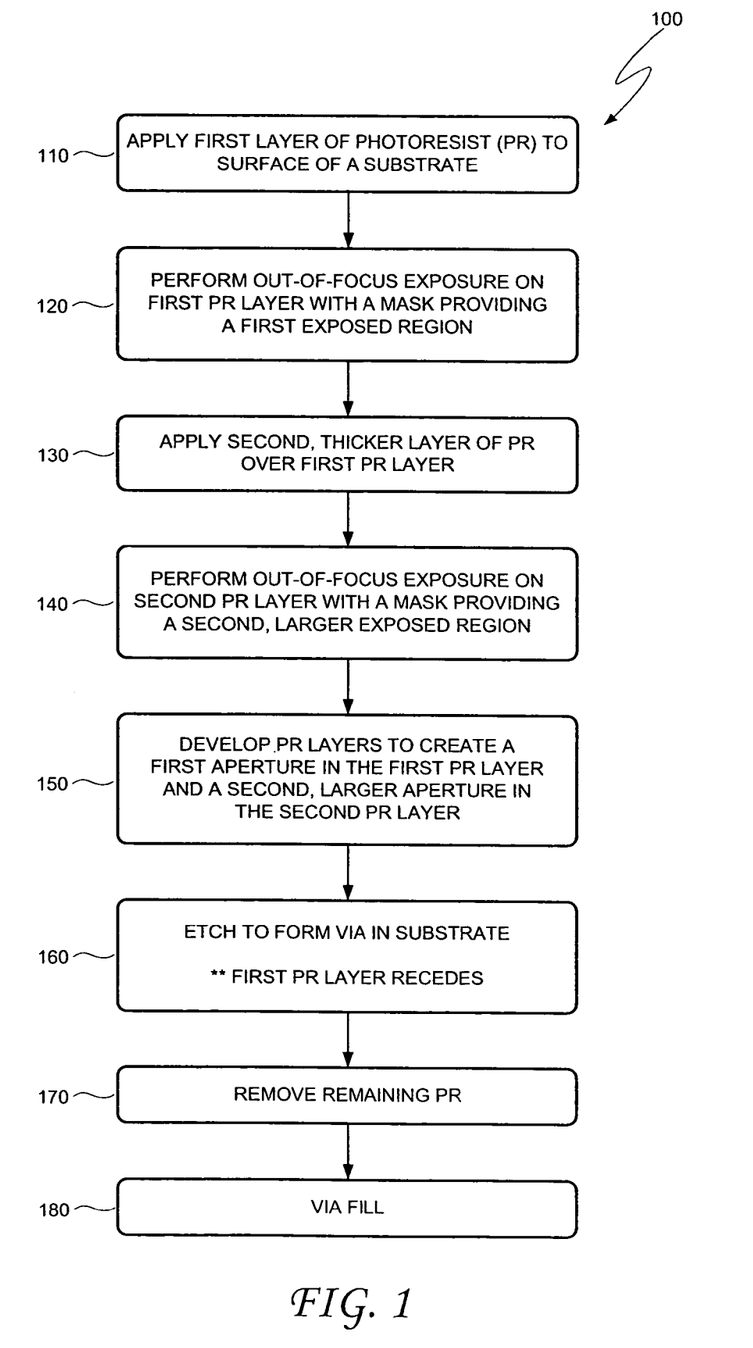
FIG. 1 is a block diagram illustrating an embodiment of a method of forming via using a receding mask.

Turning now to FIG. 1, illustrated is an embodiment of a method 100 of forming a tapered via using a receding mask. Embodiments of the method 100 shown in FIG. 1 are further illustrated in the schematic diagrams of FIGS. 2A through 2J, and reference should be made to these figures as called out in the text.

Figure 2A:
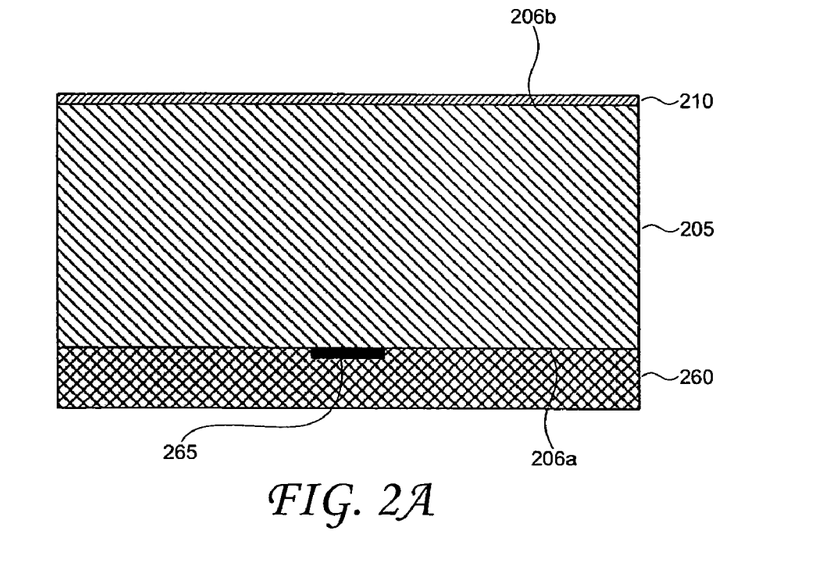
FIGS. 2A–2J are schematic diagrams illustrating embodiments of the method shown in FIG. 1.

Referring to block 110 in FIG. 1, a first layer of a photoresist (PR) is applied to the surface of a substrate. This is illustrated in FIG. 2A, which shows a substrate 205 over which a first layer of photoresist 210 has been deposited. The substrate 205 may be viewed as having a "front side" 206a and a "back side" 206b (the substrate 205 is depicted face down in the figures), and the first photoresist layer is deposited over the substrate's back side 206b. It should be understood, however, that the labels "front side" and "back side" are arbitrary and, further, that the various surfaces of the substrate 205 may be referenced by any suitable convention.

In one embodiment, the substrate 205 comprises a semiconductor wafer upon which integrated circuitry for a number of die has been (or is to be) formed. For ease of explanation, the substrate 205 will hereinafter be referred to as a wafer; however, it should be understood that the disclosed embodiments are not limited in application to semiconductor wafers. Typically, the integrated circuitry (not shown in figures) is formed over the front side 206a of the wafer 205, and this integrated circuitry may include a collection of circuit elements, such as transistors, diodes, capacitors, and resistors, as well as signal lines and other conductors that interconnect these various circuit elements. The semiconductor wafer 205 may comprise any suitable material, such as silicon, silicon-on-insulator (SOI), Gallium Arsenide (GaAs), or other material or combination of materials. In one embodiment, the wafer 205 has a thickness of between 75 μm and 150 μm. According to another embodiment, the back side 206b of wafer 205 has been thinned prior to application of the first photoresist layer 210.

In one embodiment, as shown in the figures, an interconnect structure 260 has been formed over the front side 206a of wafer 205. The interconnect structure 260 includes a number of levels of metallization, each level of metallization comprising a layer of dielectric material in which a number of conductors (e.g., traces) has been formed. One of these conductors 265 is shown in FIGS. 2A–2J. The conductors in any given level of metallization are separated from the conductors of adjacent levels by the dielectric material, and the conductors of adjacent levels are electrically interconnected by conductive vias extending between these levels. The conductors and vias may comprise any suitable conductive material, such as copper (Cu), aluminum (Al), gold (Au), silver (Ag), or alloys thereof. The dielectric material may comprise any suitable dielectric or insulating material, such as silicon dioxide ($SiO_2$), SiOF, carbon-doped oxide (CDO), a glass, or a polymer material.

Again, as noted above, a first layer of photoresist 210 has been applied over the back side 206b of the wafer 205. The photoresist material 210 may comprise any material suitable for a photolithography process. Also, photoresist 210 may function as either a negative photoresist or a positive photoresist. Examples of photoresist materials include STR-1045 available from the Shipley Corporation, and a cresol novolak resin with photoactive compounds. The first photoresist layer 210 may be deposited by any suitable method, such as a spin coating technique. In one embodiment, the first photoresist layer 210 has a thickness of between 1 and 5 μm. The thickness of the first photoresist layer 210 may determine the depth of a lower (smaller diameter) portion of a via that is to be formed, as will be described below.

Figure 2B:
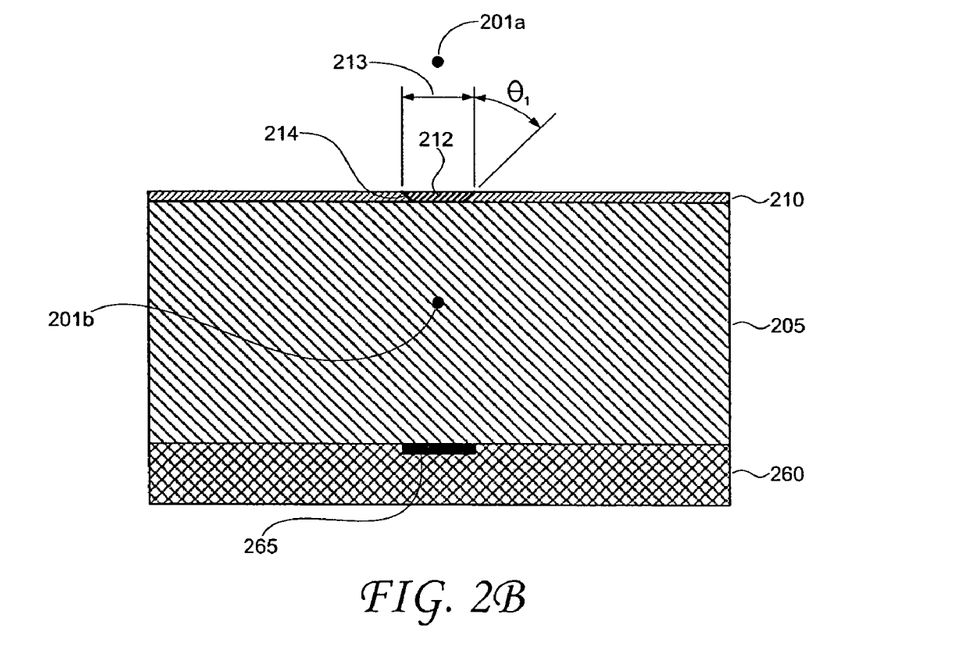

Returning to FIG. 1, and block 120 in particular, an out-of-focus exposure is performed on the first photoresist layer with a mask providing a first exposed region in the first photoresist layer. This is illustrated in FIG. 2B, where the first photoresist layer 210 has been exposed to create a first exposed region 212 having a diameter 213. The out-of-focus exposure can result in the formation of a tapered periphery 214 on the first exposed region 212. To perform the out-of-focus exposure, the focal point of the lens (or lens system) used to project the mask onto the first photoresist layer 210 can be set either above (see point 201a) or below (see point 201b) the first photoresist layer. The distance by which this focal point is offset either above or below the first photoresist layer will depend upon the desired angle of taper ($\theta_1$) on periphery 214, the thickness of this photoresist layer 210, the material properties of the photoresist, the characteristics of the illumination source, as well as other processing conditions. In one embodiment, the tapered periphery 214 has an angle $\theta_1$ of between 15 and 75 degrees. Also, according to one embodiment, the angle of taper ($\theta_1$) on periphery 214 can be adjusted to obtain a desired shape of a via that is to be formed, as will be described below.

Figure 2C:
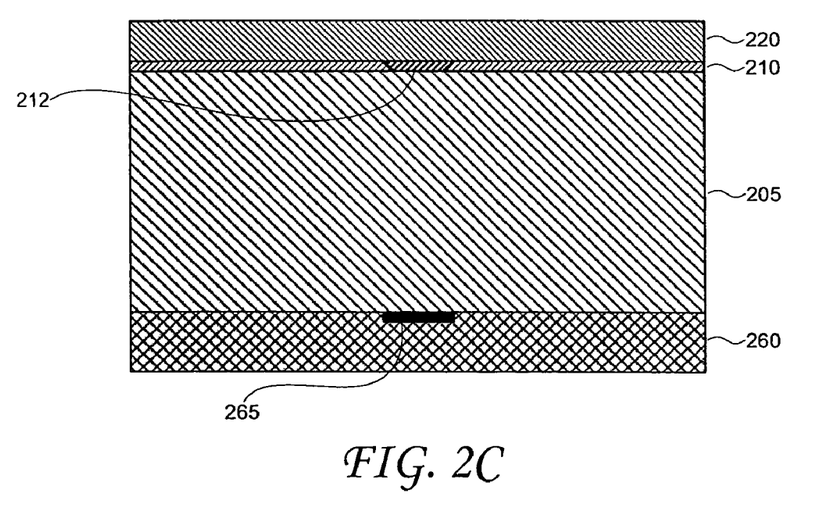

As set forth in block 130, a second, relatively thicker layer of photoresist is deposited over the first photoresist layer. This is illustrated in FIG. 2C, which shows a second layer of photoresist 220 that has been formed over first photoresist layer 210. As with first photoresist layer 210, the second photoresist layer 220 may comprise any material suitable for a photolithography process, and the photoresist 220 may function as either a negative photoresist or a positive photoresist. Examples of photoresist materials include STR-1045 available from the Shipley Corporation, and a cresol novolak resin with photoactive compounds. The second photoresist layer 220 may be deposited by any suitable method, such as a spin coating technique. In one embodiment, the first and second photoresist layers 210, 220 comprise the same material; however, in other embodiments, these two layers may comprise different photoresist materials.

As suggested above, the second photoresist layer 220 is thicker than the first photoresist layer 210. The first and second photoresist layers 210, 220 form an etch mask for a subsequent etching process, which will be described below in more detail. During this subsequent etching process, the first photoresist layer 210 will recede due to etching. However, the second photoresist layer 220 should be deposited to a thickness such that, after etching, a sufficient amount of the second photoresist layer remains to preserve the integrity of this portion of the etch mask (e.g., the second photoresist layer should not substantially recede). According to one embodiment, the ratio of the thickness of the second photoresist layer 220 to the thickness of the first photoresist layer 201 is between 1:1 and 10:1. In one embodiment, the second photoresist layer 220 has a thickness of between 5 and 10 μm. Because the second photoresist layer 220 does not substantially recede during etching, this layer serves to protect the remainder of wafer 205 and to "set" the diameter of an upper (larger diameter) portion of a via that is to be formed, as will be described below.

Figure 2D:
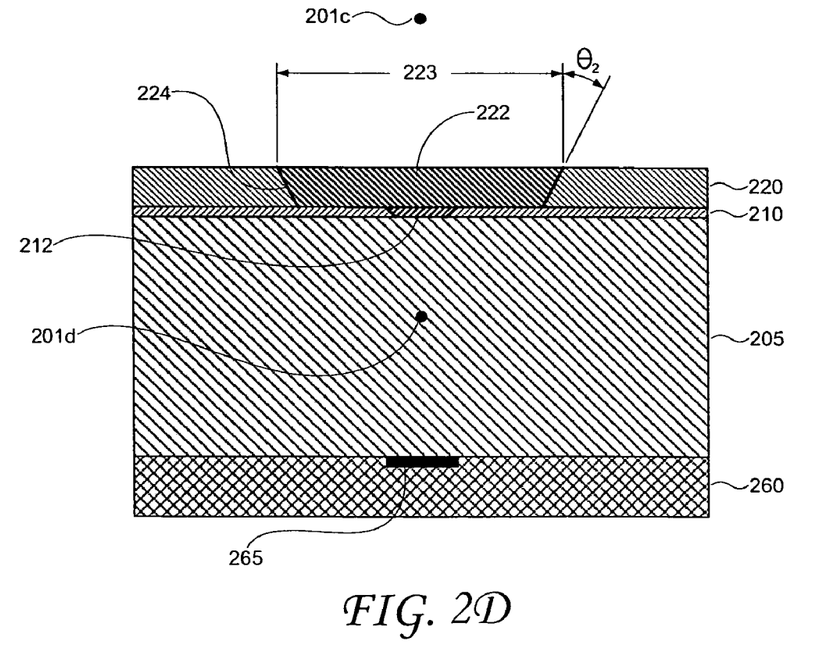

Referring next to block 140, an out-of-focus exposure is performed on the second photoresist layer with a mask providing a second, larger exposed region in the second photoresist layer. This is illustrated in FIG. 2D, where the second photoresist layer 220 has been exposed to create a second exposed region 222 having a diameter (or width) 223. According to one embodiment, the diameter (or width) 223 of second exposed region 222 is larger than the diameter (or width) 213 of the underlying first exposed region 212 in first photoresist layer 210, and the periphery 214 of the first exposed region 212 lies within (or at least substantially within) the periphery 224 of second exposed region 222.

As with formation of the first exposed region 212, the out-of-focus exposure of the second photoresist layer 220 can result in the creation of a tapered periphery 224 on the second exposed region 222. To perform the out-of-focus exposure, the focal point of the lens (or lens system) used to project the mask onto the second photoresist layer 220 can be set either above (see point 201c) or below (see point 201d) the second photoresist layer. Again, the distance by which this focal point is offset either above or below the second photoresist layer 220 will depend upon the desired angle of the taper ($\theta_2$) on periphery 224, the thickness of this photoresist layer 220, the material properties of the photoresist, the characteristics of the illumination source, as well as other processing conditions. According to one embodiment, the tapered periphery 224 has an angle $\theta_2$ of between 0 and 75 degrees. In one embodiment, $\theta_2$ is approximately the same as $\theta_1$; however, in another embodiment $\theta_1$ and $\theta_2$ are different. The angle of taper ($\theta_2$) on periphery 24, as well as the angle of taper ($\theta_1$) on periphery 214 of first exposed region 212, can be adjusted to obtain a desired shape of a via that is to be formed, as will be described below.

Figure 2E:
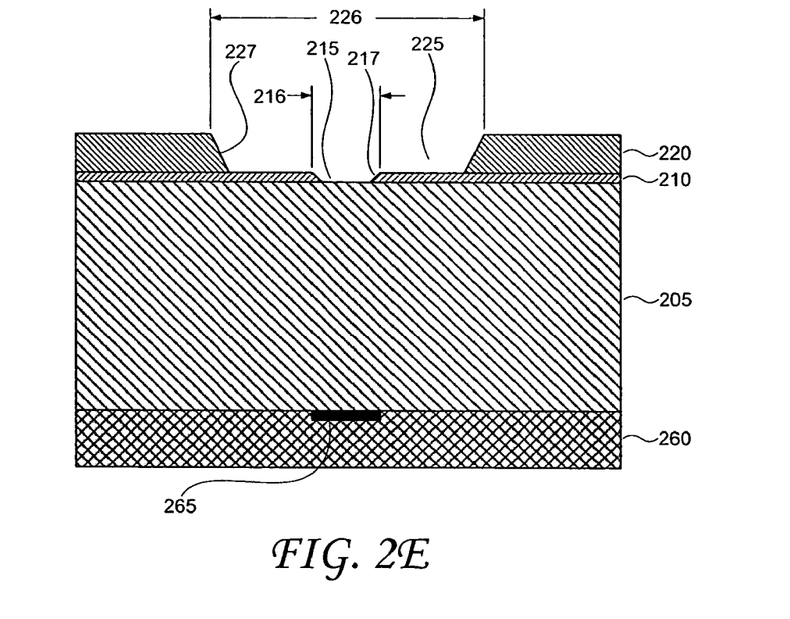

As set forth in block 150, the photoresist layers are developed to create a first aperture in the first photoresist layer and a second, larger aperture in the second photoresist layer, wherein each of the apertures has a tapered periphery. This is illustrated in FIG. 2E, where the second photoresist layer 220 has been developed to create a second aperture 225 having a diameter 226 and a tapered periphery 227. Further, the first photoresist layer 210 has been developed to create a first aperture 215 having a diameter 216 and a tapered periphery 217. Any suitable development process (or processes) may be employed to develop the first and second photoresist layers 210, 220.

In one embodiment, the diameter 216 of first aperture 215 is smaller than the diameter 226 of second aperture 225, and the tapered periphery 217 of the first aperture lies within (or at least substantially within) the tapered periphery 227 of the second aperture. Generally, diameter 216 and tapered periphery 217 of first aperture 215 correspond to the diameter 213 and tapered periphery 214, respectively, of first exposed region 212. Similarly, the diameter 226 and tapered periphery 227 of second aperture 225 generally correspond to the diameter 223 and tapered periphery 224, respectively, of second exposed region 222. In one embodiment, the first and second apertures 215, 225 are substantially circular in shape, and in a further embodiment these apertures 215, 225 are substantially concentric. However, in other embodiments, the apertures 215, 225 may not be circular and/or these apertures may not be concentric.

Figure 2F:
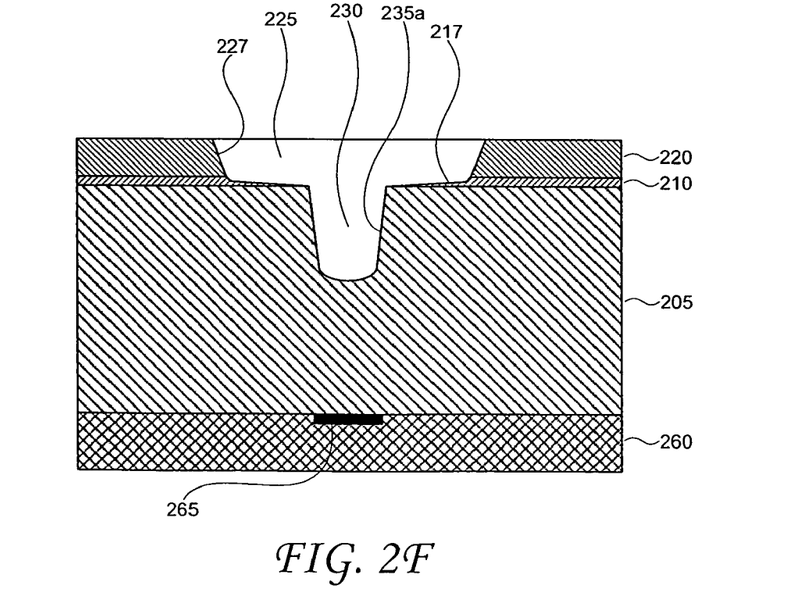
Figure 2G:
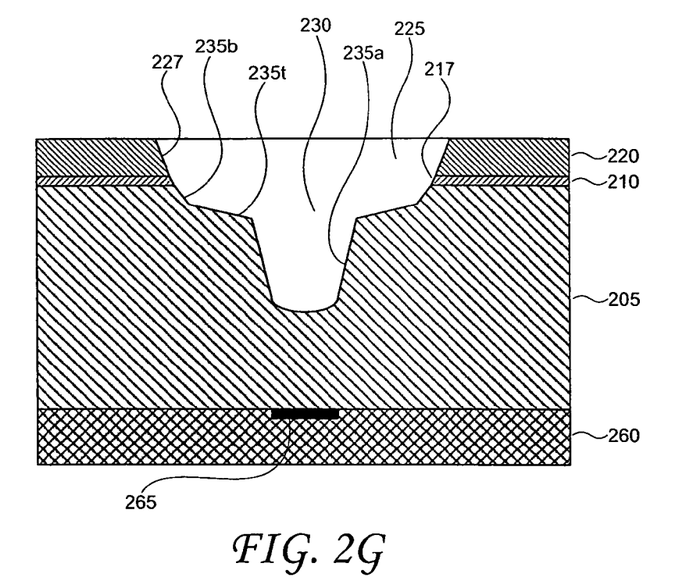
Figure 2H:
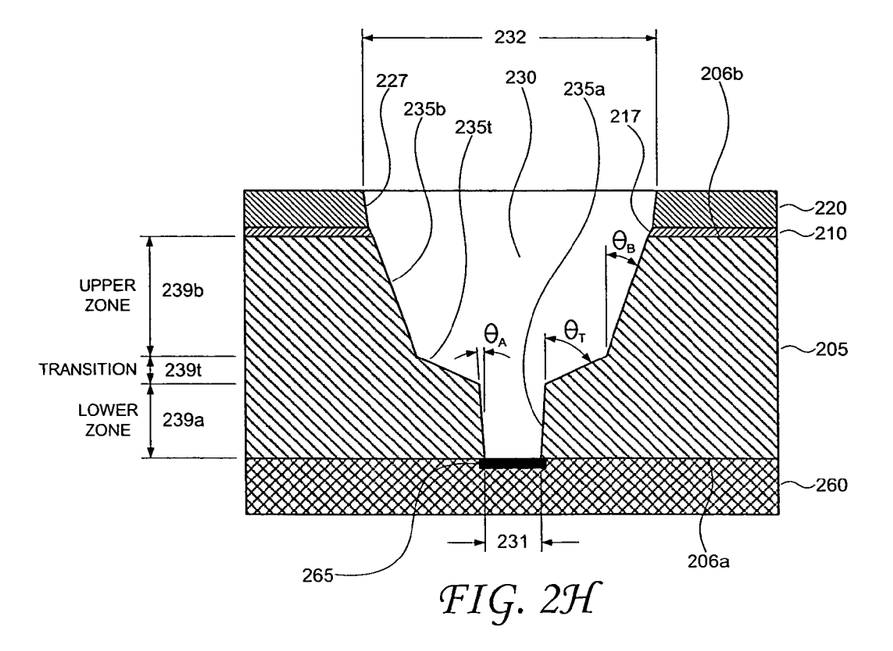

With reference now to block 160 in FIG. 1, etching is performed to form a via in the wafer (or other substrate). This is illustrated in FIGS. 2F through 2H. Turning first to FIG. 2F, etching has commenced to begin formation of a via 230 in wafer 205. Any suitable etching technique may be used to form via 230, such as a plasma etch, a chemical etch, etc. The peripheral wall 235*a* of via 230 is tapered, and this taper results, in part, from the tapered periphery 217 of first aperture 215 in first photoresist layer 210. Note also, as shown in FIG. 2F, that a portion of the first photoresist layer 210 is thinning as etching progresses, with the first photoresist layer maintaining its original thickness around the periphery of the second aperture 225 (of second photoresist layer 220) and becoming gradually thinner toward the periphery of the first aperture 215. As etching continues, the periphery 217 of the first aperture 215 in first photoresist layer 210 will recede outwardly towards the periphery 227 of the second aperture 225. The taper of peripheral wall 235*a* may also be due, in part, to this receding photoresist layer.

Referring next to FIG. 2G, the periphery 217 of the aperture in the first photoresist layer 210 has fully receded to the periphery 227 of the second aperture 225 in second photoresist layer 220, and etching has continued. At the point when the periphery 217 of the first photoresist layer is near or has reached the periphery 227 of the overlying second photoresist layer aperture 225, a transition occurs. More specifically, a lower portion of via 230 has a tapered wall 235*a*, and when the periphery 217 of the first photoresist layer approaches the periphery 227 of the overlying second photoresist layer aperture 225, the via 230 transitions to an upper portion of the via having a tapered wall 235*b*. That portion of the via wall over which this transition occurs—e.g., that portion of the via wall formed when the receding first photoresist layer 210 approaches the second photoresist layer 220—is denoted in FIG. 2G by reference numeral 235*t*. The peripheral wall 235*b* of the upper portion of via 230 is also tapered, and this taper results, in part, from the tapered periphery 227 of second aperture 225 in second photoresist layer 220. Etching now continues, with the etch mask essentially comprising the second aperture 225 in second photoresist layer 220 (and an aperture of similar size now formed in the first photoresist layer 210, which is fully or nearly fully receded).

Referring now to FIG. 2H, etching is complete and the via 230 extends through the wafer 205 and down to the conductor 265 of interconnect structure 260. The via 230 includes a lower zone 239*a* and an upper zone 239*b*, as well as a transition region 239*t* between the lower and upper zones. The shape and profile of the lower zone 239*a* is dictated, at least in part, by the tapered periphery 217 of the aperture 215 in first photoresist layer 210 and/or by the receding first photoresist layer 210 (although etching of this zone will continue after the first photoresist layer has fully receded). The shape and profile of the upper zone 239*b* is dictated, at least in part, by the tapered periphery 227 of the second aperture 225 in second photoresist layer 220.

The wall 235*a* of the lower zone 239*a* is tapered, and in one embodiment this taper has an angle $\theta_A$ of between 0 and 20 degrees. Similarly, the wall 235*b* of the upper zone 239*b* is tapered, and according to one embodiment this taper has an angle $\theta_B$ of between 0 and 20 degrees. According to other embodiments, either or both of $\theta_A$ and $\theta_B$ may be greater than 20 degrees. In one embodiment, the angles $\theta_A$ and $\theta_B$ may be the same or substantially similar; however, in other embodiments, these two angles may be significantly different. Also, the wall 235*t* of transition region 239*t* may be tapered, and the angle of this taper is denoted by $\theta_T$. Typically, the angle $\theta_T$ will be larger than either $\theta_A$ or $\theta_B$; however, in other embodiments, the angle $\theta_T$ may be approximately the same as $\theta_A$ and/or $\theta_B$. In one embodiment, the transition region 239*t* has an angle of taper $\theta_T$ between 0 and 90 degrees, and in another embodiment the transition region has an angle $\theta_T$ between 30 and 60 degrees.

As the reader will appreciate, the structure of the etch mask formed from the first and second photoresist layer 210, 220 can be adjusted to obtain a desired shape of the via 230. As noted above, the thickness of the first photoresist layer 210, the thickness of the second photoresist layer 220, the angle of taper on the periphery 217 (which generally corresponds to the angle $\theta_1$) of the aperture 215 in the first photoresist layer 210, the diameter 216 of the aperture 215, the angle of taper on the periphery 227 (which generally corresponds to the angle $\theta_2$) of the aperture 225 in the second photoresist layer 220, and the diameter 226 of the aperture 225 are all examples of parameters of this etch mask that can be selected to achieve a desired shape for via 230. For example, the thickness of the first photoresist layer 210 may control the depth of the lower zone 239*a*, as well as the angle of taper $\theta_A$ of this zone (this angle being a result, in part, of the receding nature of this portion of the etch mask). The diameters 216, 226 of the apertures 215, 225 in the first and second photoresist layers, respectively, can be adjusted to achieve a desired diameter for each of the lower and upper zones 239*a*, 239*b* of via 230. In addition, the angles of taper on the peripheries 217, 227 of the apertures 215, 225, respectively, can be selected to achieve desired tapers $\theta_A$, $\theta_B$ on the walls 235*a*, 235*b* of the lower and upper zones 239*a*, 239*b*, respectively, of via 230 (these angle being a function, at least in part, of the angles of taper in the etch mask). Any combination of values for the above-described parameters—as well as other parameters, such as etch and other process conditions—can be utilized to form a tapered via.

As set forth above, the via 230 extends down to the conductor 265 of interconnect structure 260. Where the substrate 205 comprises a semiconductor wafer having integrated circuitry formed on the wafer's front side 206*a*, the via 230 may extend through this integrated circuitry to reach conductor 265. Generally, the via should not make contact or otherwise interfere with the integrated circuitry, and the available "real estate" through which the via 230 can be routed may be small. Conversely, at the wafer's back side 206*b*, the "real estate" available for via 230 may be much more plentiful. The via 230, however, has a small lower diameter (or width) 231 and a substantially larger upper diameter (or width) 232. In one embodiment, the lower diameter 231 has a dimension of between approximately 4 and 12 μm, and the upper diameter 232 has a dimension of between approximately 40 and 200 μm. The small lower diameter 231 of via 230 enables the routing of via 230 through the active region of the wafer 205. At the same time, by gradually increasing the size of the via 230 as the via approaches the back side 206*b*, the via is more amenable to film deposition or growth (in comparison to a via having a substantially straight side wall).

At this juncture, it should be noted that, for ease of illustration and explanation, the shape of via 230 shown in the figures has been idealized. For example, the walls 235*a*, 235*b*, 235*t* of each portion of via 230 have each been depicted as being uniformly tapered and having smooth surfaces. Further, the transition from the wall 235*a* of lower zone 239a to the wall 235t of transition region 239t, as well as the transition from the wall 235t of the transition region to the wall 235b of the upper zone 239b, are each depicted as occurring at well-defined planes (e.g., the angles between these zones are shown as being sharp, rather than rounded). However, as the reader will appreciate, a via created according to the disclosed embodiments may not, in practice, have the precise shape shown in the figures. By way of example, the walls of the various portions of via 230 may not be uniformly smooth and, further, the profile of the via may be rounded at various points (e.g., over the transition region 239t between the lower and upper zone 235a, 235b). Thus, it should be understood that the figures are schematic representations provided as an aid to understanding the disclosed embodiments, and no unnecessary limitations should be drawn from the figures.

Figure 2I:
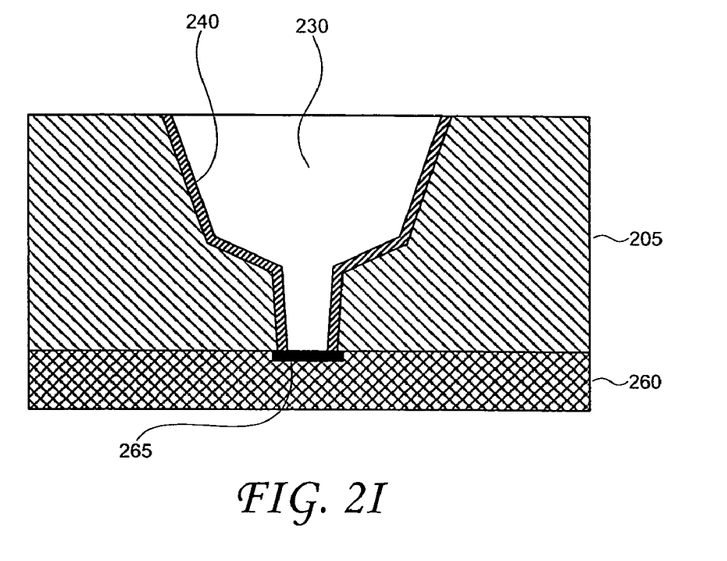

Returning again to FIG. 1, after etching, the remaining photoresist can be removed, as set forth in block 170. This is illustrated in FIG. 2I, where the remaining first and second photoresist layers have been removed. Any suitable process (or processes) may be employed to strip the remaining photoresist material.

Figure 2J:
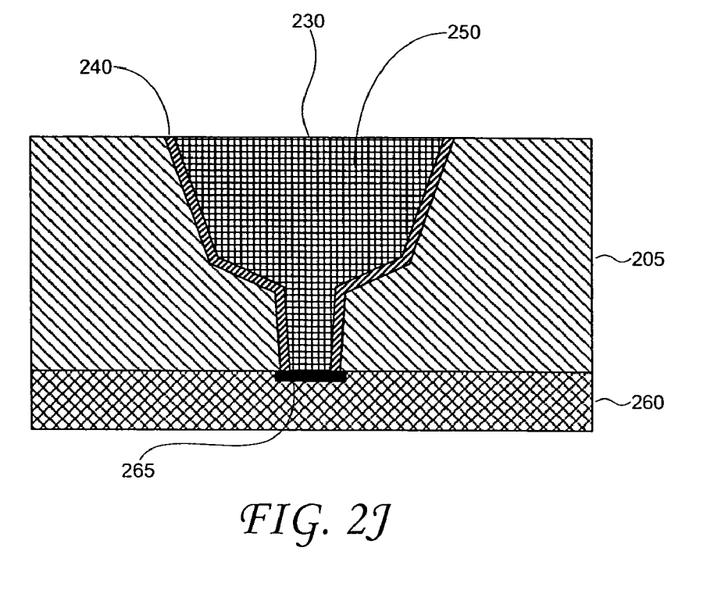

Referring to block 180, the via may be coated and/or filled. This is illustrated, by way of example, in FIGS. 2I and 2J. Referring again to FIG. 2I, a layer of an insulating material 240 has been deposited over the walls of via 230. Insulating material 240 may comprise any suitable dielectric material, such as $SiO_2$ or $Si_3N_4$, and this layer may be deposited or formed using any suitable process (e.g., thermal oxidation, chemical vapor deposition, etc.). Turning to FIG. 2J, a conductive material 250 is deposited in the via 230 and over the insulating material layer 240. Conductive material 250 may comprise any suitable electrically conductive material, such as copper, and this material may be deposited using any suitable process (e.g., electroplating, sputter or other physical vapor deposition process, etc.). Also, a planarization process (e.g., chemical-mechanical polishing) may be performed to remove excess insulating and conductive material from the wafer's back side 206b. According to one embodiment, the wafer 205 will be bonded to a second wafer to form a wafer stack that will ultimately be cut into a number of stacked die, and the conductive-filled via 230 can be used to form a backside connection on such a stacked die.

Figure 3:
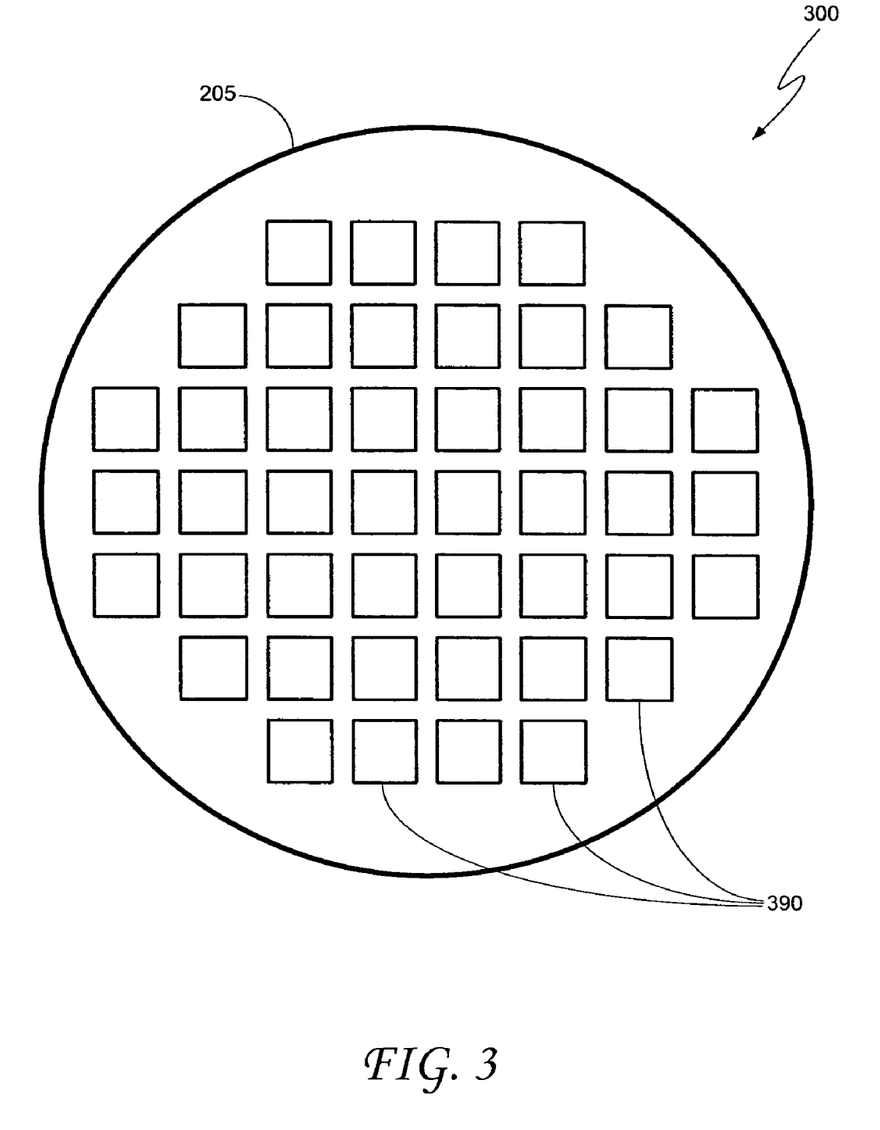
FIG. 3 is a schematic diagram illustrating an embodiment of a wafer upon which vias may be formed according to the disclosed embodiments.

Although the wafer 205 shown in FIGS. 2A through 2J includes just a single via 230 for ease of illustration, it should be understood that the disclosed embodiments of a method for forming a tapered via are typically performed at the wafer level and that such a wafer may include integrated circuitry for a number of die. This is further illustrated in FIG. 3 which shows a plan view of a wafer 300. The wafer 300 comprises a substrate 205 (e.g., Si, SOI, GaAs, etc.) upon which integrated circuitry for a number of die 390 has been formed, and wafer 300 is ultimately cut into these separate die 390. In practice, each of the die 390 may include hundreds of the vias 230 and the wafer 300 as a whole may include thousands of the vias 230.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
   forming an etch mask on a substrate, the etch mask including a first photoresist layer disposed on the substrate and a second relatively thicker photoresist layer disposed over the first photoresist layer, the etch mask further including a first aperture formed in the first photoresist layer and a relatively larger second aperture formed in the second photoresist layer, the first aperture lying within a periphery of the second aperture; and
   etching to form a via in the substrate, the first photoresist layer receding toward the second aperture periphery during etching;
   wherein a size of the second aperture remains substantially unchanged as the first photoresist layer recedes toward the second aperture.

2. The method of claim 1, wherein the receding first photoresist layer forms a taper in a wall of the via.

3. The method of claim 1, wherein a periphery of the first aperture has a tapered edge and the second aperture periphery has a tapered edge.

4. The method of claim 3, wherein a transition region is created in the via when the receding first photoresist layer reaches the second aperture periphery.

5. The method of claim 4, wherein the via includes a lower zone below the transition region and an upper zone above the transition region, and wherein the tapered edge of the first aperture creates a tapered wall in the lower zone of the via and the tapered edge of the second aperture creates a tapered wall in the upper zone of the via.

6. The method of claim 5, wherein the receding first photoresist layer creates additional taper in the via wall of the lower zone.

7. The method of claim 5, wherein the lower zone terminates at a conductor in the substrate.

8. The method of claim 7, further comprising:
   depositing a layer of a dielectric material over the walls of the via; and
   depositing a conductive material over the dielectric layer in the via, the conductive material forming electrical contact with the conductor in the substrate.

9. The method of claim 8, wherein the substrate comprises a semiconductor wafer having integrated circuitry for a number of die formed on a front side thereof, and wherein the via extends from the conductor to a back side of the semiconductor wafer.

10. The method of claim 1, wherein the first and second apertures are each approximately circular and are substantially concentric.

11. A method comprising:
    depositing a layer of a photoresist on a substrate;
    projecting an image onto the photoresist layer using a mask, wherein a focal point of a lens used to project the mask image is above or below the photoresist layer;
    exposing the photoresist layer with the mask to form an exposed region in the photoresist layer, wherein the image projected onto the photoresist layer using the mask is out of focus to create a tapered edge along a periphery of the exposed region;
    removing the exposed region of the photoresist layer to form an aperture including a periphery having the tapered edge; and
    etching to form a via in the substrate, the tapered edge of the aperture creating a tapered wall in the via.

12. The method of claim 11, wherein the photoresist layer is sufficiently thin to be removed during etching and the photoresist layer recedes outwardly from the aperture periphery during etching.

13. The method of claim 12, wherein the receding photoresist layer creates additional tapering in the via wall.

14. A method comprising:
   depositing a first layer of photoresist on a substrate;
   exposing the first photoresist layer with a mask to create a first exposed region having a first diameter;
   depositing a second layer of photoresist over the first photoresist layer, the second photoresist layer having a thickness greater than a thickness of the first photoresist layer;
   exposing the second photoresist layer with another mask to create a second exposed region having a second diameter larger than the first diameter, the second exposed region overlying the first exposed region;
   removing the photoresist in the second exposed region to form a second aperture and removing the photoresist in the first exposed region to form a relatively smaller first aperture lying within a periphery of the second aperture, wherein a periphery of the first aperture has a tapered edge and the second aperture periphery has a tapered edge; and
   etching to form a via in the substrate, the first photoresist layer receding toward the second aperture periphery during etching.

15. The method of claim 14, wherein the receding first photoresist layer forms a taper in a wall of the via.

16. The method of claim 14, wherein a transition region is created in the via when the receding first photoresist layer reaches the second aperture periphery.

17. The method of claim 16, wherein the via includes a lower zone below the transition region and an upper zone above the transition region, and wherein the tapered edge of the first aperture creates a tapered wall in the lower zone of the via and the tapered edge of the second aperture creates a tapered wall in the upper zone of the via.

18. The method of claim 17, wherein the receding first photoresist layer creates additional taper in the via wall of the lower zone.

19. The method of claim 17, the lower zone terminates at a conductor in the substrate.

20. The method of claim 19, further comprising:
   depositing a layer of a dielectric material over the walls of the via; and
   depositing a conductive material over the dielectric layer in the via, the conductive material forming electrical contact wit the conductor in the substrate.

21. The method of claim 20, wherein the substrate comprises a semiconductor wafer having integrated circuitry for a number of die formed on a front side thereof, and wherein the via extends from the conductor to a back side of the semiconductor wafer.

22. The method of claim 14, wherein the first and second apertures are each approximately circular and are substantially concentric.

* * * * *